United States Patent
Abe et al.

(10) Patent No.: US 7,150,669 B2
(45) Date of Patent: Dec. 19, 2006

(54) ELECTROLUMINESCENT PANEL AND A MANUFACTURING METHOD THEREFOR

(75) Inventors: Hisashi Abe, Hirakata (JP); Koji Suzukii, Aichi (JP); Isao Hasegawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 30 days.

(21) Appl. No.: 10/378,661

(22) Filed: Mar. 5, 2003

(65) Prior Publication Data

US 2003/0209976 A1    Nov. 13, 2003

(30) Foreign Application Priority Data

Mar. 5, 2002 (JP) .............................. 2002-059590
Jan. 30, 2003 (JP) .............................. 2003-022757

(51) Int. Cl.
*H01J 9/00*      (2006.01)
*H01J 9/38*      (2006.01)
*H05B 33/10*   (2006.01)

(52) U.S. Cl. ........................... 445/24; 445/40; 313/506

(58) Field of Classification Search ................ 313/500, 313/504, 506, 512; 428/690, 917; 427/66; 445/5, 6, 24, 25, 40
See application file for complete search history.

(56) References Cited

U.S. PATENT DOCUMENTS

| | | | |
|---|---|---|---|
| 3,662,210 A | | 5/1972 | Maximov |
| 5,517,080 A | | 5/1996 | Budzilek et al. |
| 5,543,745 A | | 8/1996 | Notani |
| 5,780,351 A | * | 7/1998 | Arita et al. ................ 438/396 |
| 5,945,008 A | * | 8/1999 | Kisakibaru et al. ........... 216/71 |
| 6,075,319 A | | 6/2000 | Kanda et al. |
| 6,093,934 A | | 7/2000 | Yamazaki et al. |
| 6,124,604 A | | 9/2000 | Koyama et al. |
| 6,281,552 B1 | * | 8/2001 | Kawasaki et al. ........... 257/350 |
| 6,333,528 B1 | * | 12/2001 | Arita et al. ................. 257/295 |
| 6,356,029 B1 | | 3/2002 | Hunter |
| 6,407,534 B1 | | 6/2002 | Mukainakano |
| 6,489,046 B1 | | 12/2002 | Ikeda et al. |
| 6,498,517 B1 | | 12/2002 | Miyazaki |
| 6,501,466 B1 | | 12/2002 | Yamagishi et al. |
| 6,525,704 B1 | | 2/2003 | Kondo et al. |
| 6,528,824 B1 | | 3/2003 | Yamagata et al. |
| 6,579,787 B1 | * | 6/2003 | Okura et al. ................. 438/622 |
| 6,583,581 B1 | | 6/2003 | Kaneko et al. |
| 6,686,693 B1 | | 2/2004 | Ogawa |

(Continued)

FOREIGN PATENT DOCUMENTS

CN    1214799 A    4/1999

(Continued)

OTHER PUBLICATIONS

Office Action issued on Aug. 23, 2005 in Japanese Patent Application No. 2002-066143.

(Continued)

*Primary Examiner*—Karabi Guharay
(74) *Attorney, Agent, or Firm*—McDermott Will & Emery LLP

(57) ABSTRACT

A second planarization insulating layer disposed under an organic EL layer is heat-treated so as to bring the moisture content thereof to an extremely low level. By lowering this moisture content to 77 ng/cm$^3$ or below, an organic EL panel can be realized where the degradation of luminescence characteristics is minimized. As an alternative method of reducing the adverse effect of moisture content on the organic EL layer, a reforming processing or coating processing may be performed on the second planarization insulating layer.

1 Claim, 4 Drawing Sheets

U.S. PATENT DOCUMENTS

| | | |
|---|---|---|
| 6,717,181 B1 | 4/2004 | Murakami et al. |
| 6,747,290 B1 | 6/2004 | Yamazaki et al. |
| 6,770,518 B1 | 8/2004 | Yamazaki et al. |
| 6,781,746 B1* | 8/2004 | Yamazaki et al. .......... 359/321 |
| 6,794,675 B1 | 9/2004 | Suzuki et al. |
| 2001/0055830 A1 | 12/2001 | Yoshimoto |
| 2002/0009818 A1 | 1/2002 | Yoshimoto |
| 2002/0084840 A1 | 7/2002 | Tsuchi |
| 2002/0093472 A1 | 7/2002 | Numao |
| 2002/0113248 A1 | 8/2002 | Yamagata et al. |
| 2002/0126073 A1 | 9/2002 | Knapp et al. |
| 2002/0190256 A1 | 12/2002 | Murakami et al. |
| 2003/0124042 A1* | 7/2003 | Nakazawa et al. ...... 423/240 R |
| 2003/0129321 A1* | 7/2003 | Aoki .......................... 427/458 |
| 2005/0116229 A1 | 6/2005 | Yoshimoto |

FOREIGN PATENT DOCUMENTS

| | | | |
|---|---|---|---|
| CN | 1223014 A | 7/1999 |
| CN | 1372325 A | 10/2002 |
| JP | 61-138259 | 8/1986 |
| JP | 63-250873 | 10/1988 |
| JP | 01-289140 | 11/1989 |
| JP | 02-39536 | 2/1990 |
| JP | 02-039536 | 2/1990 |
| JP | 5-249916 | 9/1993 |
| JP | 8-54836 | 2/1996 |
| JP | 8-129358 | 5/1996 |
| JP | 8-306693 | 11/1996 |
| JP | 10-319872 | 12/1996 |
| JP | 09-148586 | 6/1997 |
| JP | 09-312292 | 12/1997 |
| JP | 10-32202 A | 2/1998 |
| JP | 10-163132 | 6/1998 |
| JP | 10-170955 | 6/1998 |
| JP | 10-199827 | 7/1998 |
| JP | 10-275683 A | 10/1998 |
| JP | 11-111990 | 4/1999 |
| JP | 11-219146 | 8/1999 |
| JP | 11-260562 | 9/1999 |
| JP | 2000-221903 | 8/2000 |
| JP | 2000-236097 | 8/2000 |
| JP | 2000-277607 | 10/2000 |
| JP | 2000-347621 | 12/2000 |
| JP | 2000-347821 A | 12/2000 |
| JP | 2000-349298 | 12/2000 |
| JP | 2001-68667 | 2/2001 |
| JP | 2001-60076 | 3/2001 |
| JP | 2001-080978 | 3/2001 |
| JP | 2001-109395 A | 4/2001 |
| JP | 2001-244076 A | 9/2001 |
| JP | 2001-282136 | 10/2001 |
| JP | 2001-308094 | 11/2001 |
| JP | 2001-326079 A | 11/2001 |
| JP | 02-39538 | 12/2001 |
| JP | 2001-350449 | 12/2001 |
| JP | 2001-357972 A | 12/2001 |
| JP | 2002-12861 A | 1/2002 |
| JP | 2002-040963 A | 2/2002 |
| JP | 2002-318553 A | 10/2002 |
| JP | 2002-334790 | 11/2002 |
| JP | 2003-168570 A | 6/2003 |
| JP | 2003-196811 | 7/2003 |
| WO | WO 97/36324 | 10/1997 |
| WO | WO 98/38407 | 6/1998 |
| WO | WO98/36407 | 8/1998 |
| WO | WO 98/38407 | 8/1998 |
| WO | WO 98/45881 | 10/1998 |
| WO | WO 01/06484 A1 | 1/2001 |
| WO | WO 01/76852 A1 | 10/2001 |

OTHER PUBLICATIONS

L. Brewer et al., "AI-Mo (Aluminum-Molybdenum)", Binary Alloy Phase Diagrams, vol. 1, Dec. 1980, pp. 133-134.
Chinese Office Action for Corresponding Application No. 03107100.7, Application Date: Mar. 5, 2003.

* cited by examiner (a)

(b)

(c)

(a)

(b)

(c)

ELECTROLUMINESCENT PANEL AND A MANUFACTURING METHOD THEREFOR

BACKGROUND OF THE INVENTION

1. Field of the Invention

The present invention relates to an electroluminescent panel and a method of manufacturing the electroluminescent panel.

2. Description of the Related Art

An organic electroluminescent panel (hereinafter referred to as "organic EL panel") is a display panel featuring higher visibility than a liquid crystal panel because of its self-luminescence and thinness and light weight because of the absence of backlight. It is a focus of attention as a display panel to replace the liquid crystal panel in the near future. Generally, an organic electroluminescent element (hereinafter referred to as "organic EL element") used in the organic EL panel emits light when electrons injected from an electron injecting electrode to an electron transport layer are recombined with holes injected from a hole-injecting electrode to a hole transport layer at the interface between the luminescent layer and the hole transport layer or within the luminescent layer near the interface. Organic EL elements to display colors are manufactured by forming an organic luminescent layer by vapor deposition of organic material capable of emitting red, green and blue lights. Recently, active-matrix type organic EL panels provided with thin film transistors (TFTs) as switching elements are drawing much attention as a most promising next-generation flat panel display, and are therefore being developed at a high pitch.

Permeation of moisture compromises the reliability of organic EL elements; therefore, in manufacturing an organic EL panel, the outer surface of the organic EL elements is covered with a metal can or like encapsulation as a sealing structure capable of preventing the entry of moisture from outside. As another proposed arrangement, Japanese Patent Application Laid-Open No. Hei11-260562 discloses that an $SiO_x$ layer is formed between an organic layer and an organic EL layer as a structure that protects the organic EL layer from the entry of organic layer components or moisture.

In actuality, however, degradation of organic EL elements caused by moisture is a phenomenon often observed with organic EL panels which are provided with the sealing structure using the metal can or metal cap. As a result of analysis, inventors of the present invention had identified the cause of the problem as the moisture contained in the TFT substrate, which permeates the organic EL elements, thus compromising the reliability of the organic EL elements.

The $SiO_x$ layer that protects the organic EL layer against moisture, disclosed in the above published application, does not provide an excellent barrier against moisture. Furthermore, in forming the $SiO_x$ layer on the organic layer, the film must be formed at low temperatures to protect the organic layer, so that it is not possible to form a perfectly tight film capable of stopping the moisture from permeating the organic EL layer.

SUMMARY OF THE INVENTION

The present invention has been made in view of the foregoing circumstances and an object thereof is to provide an EL panel and the manufacturing method therefor which can solve the above-described problem.

According to a preferred embodiment of the present invention, there is provided, in order to solve the above-described problems and achieve the objects, a method of manufacturing an electroluminescent panel which includes: forming a first electrode on a substrate; forming an insulating layer in the periphery of the first electrode; performing a heat treatment on the insulating layer so that a moisture content contained in the insulating layer is substantially lowered; forming an electroluminescent layer on the insulating layer; and forming a second electrode on the electroluminescent layer. Performing heat treatment on the insulating layer disposed below the electroluminescent layer can reduce the effect of residual moisture content in the insulating layer on the reliability of an electroluminescent element. It is preferable that in the performing the heat treatment the insulating layer be heat-treated in a manner that the moisture content of the insulating layer is substantially 154 $ng/cm^3$ (nanograms per cubic centimeters) or below. In order to further improve the reliability of the electroluminescent element, it is preferable that the insulating layer be heat-treated in a manner that the moisture content of the insulating layer is substantially 77 $ng/cm^3$ or below. It is to be noted here that a unit expressed as $pg/cm^2$ (picograms per square centimeter) may be used to express the water content of a thin sample and, for example, in a case when the thickness of the insulating layer is 1,300 nm, 7.7 $ng/cm^3$ equals to 1 $pg/cm^2$. In this case, the water content of the insulating layer is preferably less than or equal to 20 $pg/cm^2$ and is further preferably less than or equal to 10 $pg/cm^2$.

The performing a heat treatment may be such that the substrate is heated in an electric furnace, or that the insulating layer is heated by irradiating electromagnetic wave thereto. Moreover, the insulating layer maybe heated by rapid thermal annealing. The method of manufacturing an electroluminescent panel according to this embodiment may further include: forming a barrier film, structured of any one of an $SiN_x$ containing layer, a diamond-like carbon containing layer and an Si thin film layer, on the insulating film, and the method may further include: forming a coating layer, made of hydrophobic material, on the insulating layer.

According to another preferred embodiment of the present invention, a method of manufacturing an electroluminescent panel includes: forming a first electrode on a substrate; forming an insulating layer in the periphery of the first electrode; performing a heat treatment on the insulating layer at temperature of substantially 200° C. to 270° C. and for substantially one to three hours; forming an electroluminescent layer on the insulating layer; and forming a second electrode on the electroluminescent layer. Performing heat treatment on the insulating layer can reduce the effect of residual moisture content in the insulating layer on the reliability of an electroluminescent element.

According to still another preferred embodiment of the present invention, a method of manufacturing an electroluminescent panel includes: forming a first electrode on a substrate; forming an insulating layer in the periphery of the first electrode; performing a reforming processing on the insulating layer so as to reduce hygroscopicity of the insulating layer; forming an electroluminescent layer on the insulating layer; and forming a second electrode on the electroluminescent layer. Performing the reforming processing on the insulating layer can not only lower the hygroscopicity of the insulating layer but also reduce residual moisture content.

The performing a reforming processing may be such that a plasma processing is performed on the insulating layer. The performing a reforming processing may be such that an ion implantation processing is performed on the insulating layer. The performing a reforming processing may be such that ultraviolet light is irradiated to the insulating layer. Moreover, the method of manufacturing an electroluminescent panel according to this embodiment may further include: forming a barrier film, structured of any one of an $SiN_x$ containing layer, a diamond-like carbon containing layer and an Si thin film layer, on the insulating film, and the method may further include: forming a coating layer, made of hydrophobic material, on the insulating layer.

According to still another preferred embodiment of the present invention, a method of manufacturing an electroluminescent panel includes: forming a first electrode on a substrate; forming an insulating layer in the periphery of the first electrode; forming a barrier film, made of any one of an $SiN_x$ containing layer, a diamond-like carbon containing layer and an Si thin film layer, on the insulating film; forming an electroluminescent layer on the barrier film; and forming a second electrode on the electroluminescent layer. By thus forming the barrier film on the insulating layer, the electroluminescent layer can be protected against moisture.

According to still another preferred embodiment of the present invention, a method of manufacturing an electroluminescent panel includes: forming a first electrode on a substrate; forming an insulating layer in the periphery of the first electrode; forming a coating layer, made of hydrophobic material, on the insulating layer; forming an electroluminescent layer on the coating layer; and forming a second electrode on the electroluminescent layer. By thus performing coating a hydrophobic material on the insulating layer, water entering the insulating layer is suppressed so as to reduce moisture content of the insulating layer, so that the electroluminescent layer can be protected against moisture.

According to still another preferred embodiment of the present invention, an electroluminescent panel comprises: a first electrode formed on a substrate; an insulating layer whose moisture content is substantially 154 $ng/cm^3$ or below, formed in the periphery of the first electrode; an electroluminescent layer formed on the insulating layer; and a second electrode formed on the electroluminescent layer. By lowering residual moisture content in the insulating layer, the effect of this residual moisture on the reliability of an electroluminescent element can be minimized.

It is to be noted that any arbitrary combination of the above-described structural components, and expressions changed between a method, an apparatus, a system and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiments are not necessarily essential to the invention.

First Embodiment

Figure 1A:
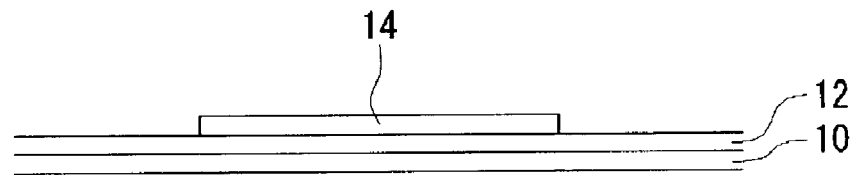
FIG. 1A shows a state where an active layer is formed, in a first embodiment according to the present invention.

FIGS. 1A to 1C and 2A to 2C show a process for manufacturing an organic EL panel according to a first embodiment of the present invention. FIG. 1A is an illustration of a state where an active layer 14 is formed. In this process, an insulating protective film 12 which is an $SiO_2$ film is formed on a glass substrate 10 made of no-alkali glass or like material, using a plasma CVD method. An a-Si film is formed on the protective film 12 using a plasma CVD or like method, and then the a-Si film is annealed by spot irradiation repeated by scanning of laser beam, such as excimer laser, on the surface thereof, thus melting and recrystallizing the a-Si film into a p-Si film. The p-Si film is then etched into some islands to form the active layer 14.

Figure 1B:
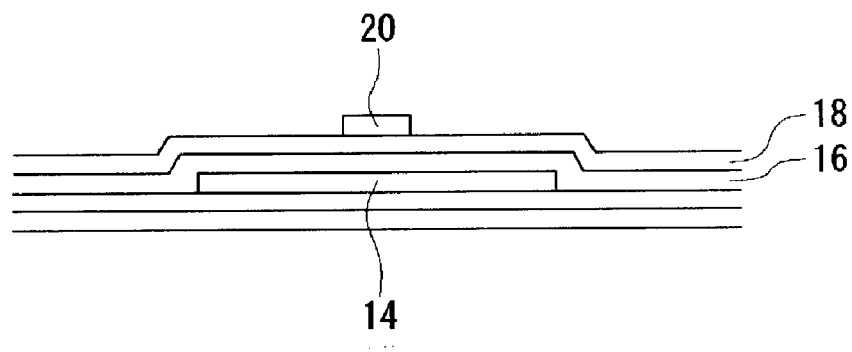
FIG. 1B shows a state where a gate electrode is formed.

FIG. 1B shows a state where a gate electrode 20 is formed. In this process, a first gate insulating film 16, which is an $SiO_2$ film, and a second gate insulating film 18, which is an SiN film, are formed on the active layer 14 which is a p-Si film, using a CVD method. Then a film of conductive material which comprises a refractory metal such as chromium (Cr) or molybdenum (Mo) is formed by sputtering on the second gate insulating film 18 and then a gate electrode 20 is formed in a position just above the active layer 14, using photolithography and dry etching technique.

Figure 1C:
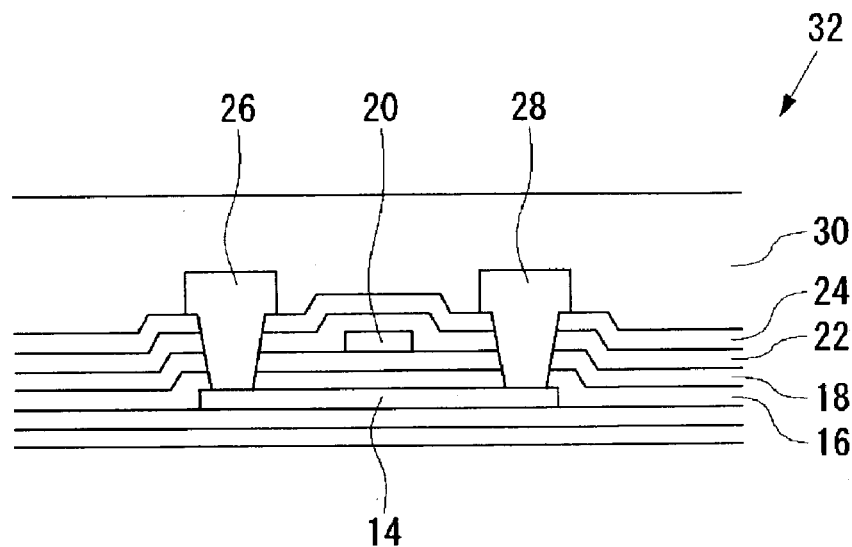
FIG. 1C shows a state where a first planarization insulating layer is formed.

FIG. 1C shows a state where a first planarization insulating layer 30 is formed. In this process, P-type or N-type impurity ions are first implanted into the active layer 14 through the second gate insulating film 18 and the first gate insulating film 16, using the gate electrode 20 as a mask. At the active layer 14, there is formed a channel area below the gate electrode 20, and there are formed a source area and a drain area on the respective sides of the channel area. Then a first interlayer insulating film 22, which is an SiN film, and a second interlayer insulating film 24, which is an $SiO_2$ film, are formed on the gate electrode 20 and the second gate insulating film 18. Then contact holes reaching the active layer 14 are formed in positions corresponding to the source area and the drain area, and a source electrode 26 and a drain electrode 28 are formed by filling these contact holes with a metal such as aluminum (Al). The source electrode and drain electrode may be formed in positions replacing each other. Thereafter, the first planarization insulating layer 30 which is made of a photosensitive resin is formed thereon. This first planarization insulating layer 30 planarizes the surface by absorbing the upward projections of the source electrode 26, the drain electrode 28 and the like so that display electrodes can be formed flat in a subsequent process. By this process, a TFT substrate 32 provided with thin film transistors is formed.

Figure 2A:
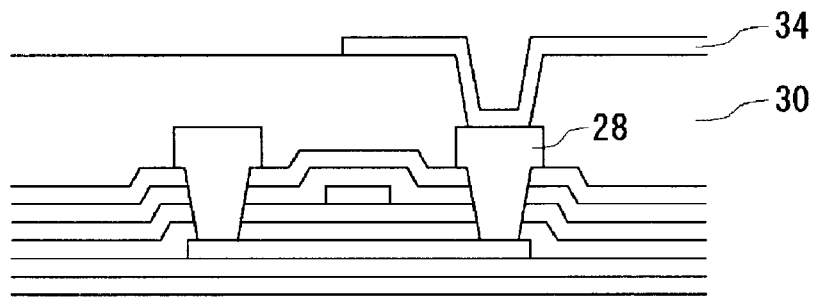
FIG. 2A shows a state where a hole injecting electrode, which is a display electrode, is formed.

FIG. 2A illustrates a state where a hole injecting electrode 34, which is a display electrode, is formed. In this process, a contact hole is first formed in the first planarization insulating layer 30 in a position corresponding to the drain electrode 28, and then the hole injecting electrode 34 which is a display electrode is formed by depositing indium tin oxide (ITO), which is a transparent electrode material, on the thus formed contact hole.

Figure 2B:
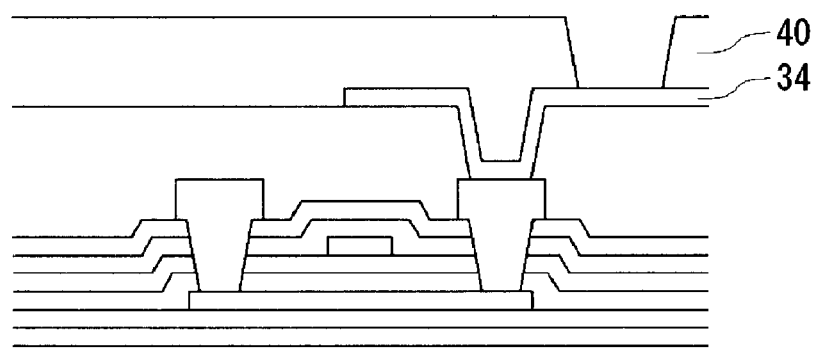
FIG. 2B shows a state where a second planarizaton insulating layer 40 is formed in the periphery of the hole injecting electrode.

FIG. 2B illustrates a state where a second planarizaton insulating layer 40 is formed around the hole injecting electrode 34. In this process, a photosensitive resin is first deposited, and then a contact hole is formed in a position corresponding to the hole injecting electrode 34 and the second planarization insulating layer 40 is formed around and above the hole injecting electrode 34. This second planarization insulating layer 40 is provided to prevent a short circuit with an electron injecting electrode, which may result from the level difference to be produced by the thickness of the hole injecting electrode 34.

In the first embodiment, a heat treatment is performed immediately after the forming of the second planarization insulating layer 40 in order to minimize moisture contained in the second planarization insulating layer 40. For a typical planarization insulating layer 40, the moisture content thereof before the heat treatment is greater than or equal to 385 ng/cm$^3$ (nanograms per cubic centimeters). When the thickness of this planarization insulating layer 40 is 1,300 nm, the moisture content thereof may be expressed as 50 pg/cm$^2$ or above. The inventors of the present invention paid special attention to the adverse effect this moisture content has on the organic EL element and demonstrated by experiment that the reliability of the organic EL element can be raised by removing the moisture as much as possible.

Figure 3:
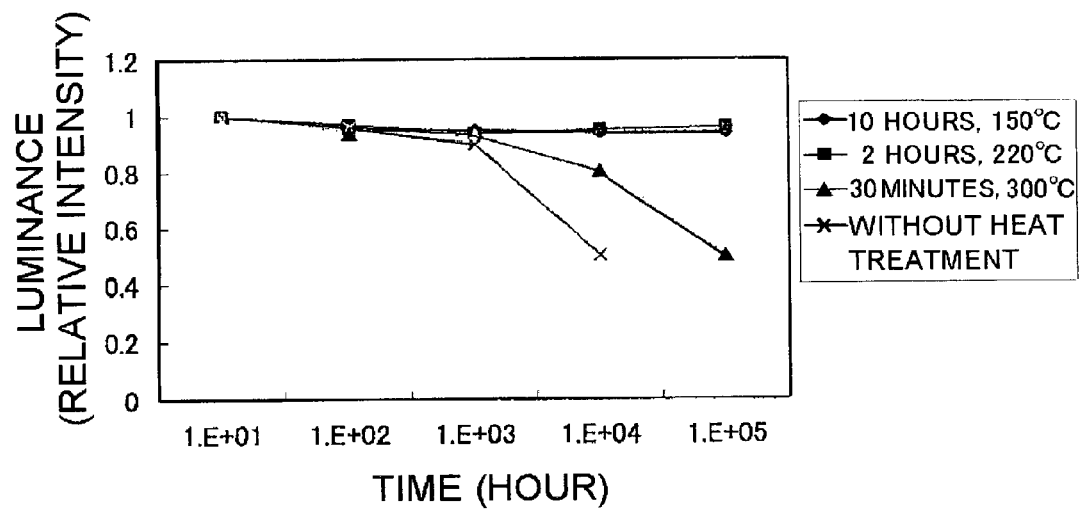
FIG. 3 shows the results of an experiment on luminescence characteristics of an organic EL element when a heat treatment was performed according to the first embodiment.

Using a sample for which the second planarization insulating layer 40 was made of a heat-resistant transparent photosensitive acrylic resin, the inventors of the present invention have demonstrated that the reliability of the organic EL element, which will last 100,000 hours or more, can be achieved by holding the moisture content of the second planarization insulating layer 40 after the heat treatment at 77 ng/cm$^3$ or below. It has also been demonstrated that the moisture content thereof may be 154 ng/cm$^3$ or below if the permissible drop of luminance of the organic EL element after 100,000 hours of use is set at 20%. The luminance drop of 20% after 100,000 hours of use is considered permissible for practical purposes. Accordingly, in the heat treatment process, the second planarization insulating layer 40 is heat-treated in such a manner that the moisture content of this insulating layer becomes 154 ng/cm$^3$ or below, or more preferably 77 ng/cm$^3$ or below. FIG. 3 shows the results of an experiment on luminescence characteristics of the organic EL element when a heat treatment has been performed so that the moisture content of the second planarization insulating layer becomes 77 ng/cm$^3$ or below. The vertical axis represents the luminance (relative intensity) whereas the horizontal axis represents the time of use (in hours). The heat treatment was carried out in a nitrogen atmosphere at atmospheric pressure. For comparison, the luminescence characteristics of the organic EL element for which no heat treatment is performed are also shown. The moisture content of the second planarization insulating layer 40 for which no heat treatment is performed is 385 ng/cm$^3$ or above. The results of this experiment indicate that when no heat treatment is performed, the luminescence characteristics begin deteriorating at about 100 hours of use, thus it turns out that the organic EL without the heat treatment will not survive the long-term usage. It is also evident that when the heat treatment is conducted at 300° C. for 30 minutes, the luminescence characteristics begin worsening gradually past about 1,000 hours. Furthermore, another experiment revealed that heating at temperatures above 270° C. adversely affects the characteristics of thin film transistors (TFTs) that exist in layers beneath the second planarization insulating layer 40. Hence, when the heat treatment is performed at 300° C., the deteriorated response characteristics of the TFTs are believed to be a cause of worsened luminescence characteristics of the organic EL element.

On the other hand, it is learned, by comparing a case when the heat treatment is performed at 150° C. for ten hours with a case when the heat treatment is performed at 220° C. for two hours, that the luminescence characteristics of the organic EL element hardly deteriorate ever after 100,000 hours of use. However, the processing time necessary for the heat treatment at 150° C. is too long to be suitable for mass production. It is evident from the above experiments that preferable is performing the heat treatment on the planarization insulating layer 40 at 200° C. to 270° C. for one to three hours, and further preferable is performing the heat treatment thereon at 220° C. for two hours.

Figure 2C:
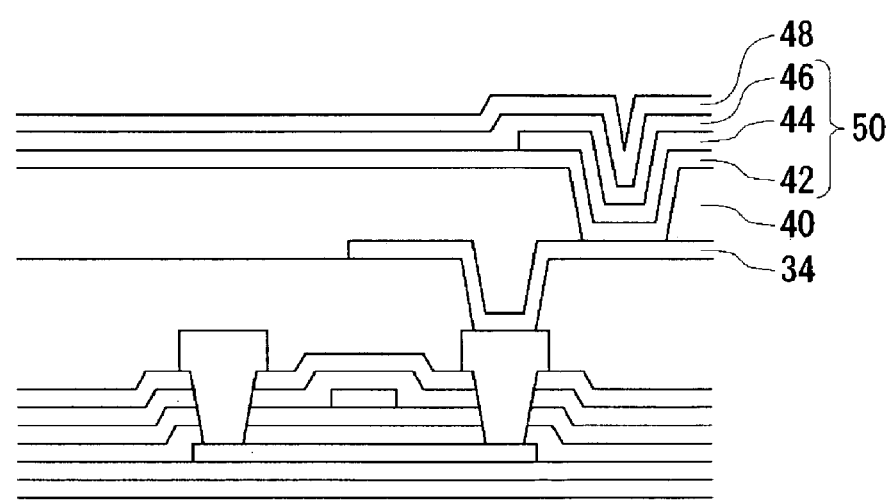
FIG. 2C shows a state where an organic EL layer and an electron injecting electrode are formed.

FIG. 2C illustrates a state where an organic EL layer 50 and an electron injecting electrode 48 are formed. In this process, a hole transport layer 42 is first deposited, and a luminescent layer 44 and an electron transport layer 46 are deposited, in this order, so that the organic EL layer 50 is formed on the planarization insulating layer 40 and the hole injecting electrode 34. For example, 4,4',4''-tris(3-methylphenylphenylamino)triphenylamine (MTDATA), N,N'-Di (naphthalene-1-yl)-N,N'-diphenyl-benzidine, N,N'-diphenyl-N,N'-di(3-methylphenyl)-1,1'-biphenyl-4,4'-diamine and so forth may be used as the hole transport layer. Moreover, for example, a bis(10-hydroxybenzo[h]quinolinato)beryllium complex (Bebq2) including a quinacridone derivative and so forth may be used as the luminescent layer 44. Moreover, for example, an aluminum-quinolene complex (Alq3), the Bebq2 and so forth may be used as the electron transport layer 46. Thereafter, a film of the electron injecting electrode 48 is formed on the organic EL layer 50. Examples of material used for the organic EL layer includes, for example, aluminum alloy containing a microdose of lithium therein, magnesium-indium alloy and magnesium-silver alloy. The organic EL panel according to the first embodiment is formed by carrying out the above described processes.

The embodiment wherein the second planarization insulating layer 40 is heat-treated to reduce the moisture content thereof has been described. For example, the heat treatment may be carried out by heating a TFT substrate 32 with the second planarization insulating layer 40 formed thereon in an electric furnace, in a clean oven or on a hot plate. To remove moisture, heat treatment can be effectively performed in the vacuum, but it may also be done in the atmosphere of argon or like inert gas, hydrogen, oxygen, nitrogen or dry air.

As an alternative method, the second planarization insulating layer 40 may be subjected to direct heating. That is, the second planarization insulating layer 40 is heated by irradiating it with electromagnetic waves that are absorbed thereby. Microwaves that are directly absorbed by moisture in the second planarization insulating layer 40 are preferable for this purpose. For instance, microwaves of 2.4 GHz may be irradiated at 5 kW for 10 minutes. The direct irradiation of electromagnetic waves to the second planarization insulating layer 40 can accomplish a heat treatment thereof with an excellent energy efficiency and for a short time. The atmosphere to be used is the same as one described above.

It is also possible to reduce the moisture in the second planarization insulating layer 40 by rapid thermal annealing. This method can shorten the time of heat treatment. The rapid thermal annealing method includes one wherein the whole surface of the second planarization insulating layer 40 is rapidly heated by electromagnetic waves, such as light from a flash lamp or microwaves, and one wherein a member heated to a high temperature by a heater or like heat source is moved in scanning motion relative to the TFT substrate 32. While the high-temperature member may be moved relative to the TFT substrate 32, the TFT substrate 32 may be moved relative to the high-temperature member. The atmosphere to be used is the same as one described above. This heat treatment may be performed at 300 to 450° C. for 1 to 10 minutes. As described earlier, heat treatment at 300° C. for about 30 minutes may adversely affect the TFT characteristics, but it has also been demonstrated that the deterioration of the TFT characteristics can be avoided by a sufficiently short time of heat treatment realized by the rapid thermal annealing. The shortened treatment time can improve the productivity of the organic EL panel.

Second Embodiment

In a second embodiment of the present invention, moisture absorption of the second planarization insulating layer 40 is reduced by reforming the second planarization insulating layer 40. By performing a reforming process, the moisture content of the second planarization insulating layer 40 can also be lowered. The lowered moisture content is preferably within the range as described in the first embodiment. According to the second embodiment, the reforming process is performed in substitution for the heat treatment of the first embodiment, and the other processes are the same as those described in the first embodiment. It is to be noted here that a method for manufacturing the organic EL panel may be realized by combining the heat treatment of the first embodiment with the reforming process of the second embodiment. Concrete examples of the reforming method are described hereinbelow.

Plasma Method

By exposing the TFT substrate 32 with the second planarization insulating layer 40 formed thereon to plasma, moisture is removed from the second planarization insulating layer 40, which at the same time is reformed to have reduced moisture absorption. The plasma to be used is preferably carbon fluoride, such as $CF_4$, carbon fluoride hydride, such as $CHF_3$, nitrogen, $N_2O$ or a mixed gas containing them. The plasma of a fluorine-containing gas, which is capable of turning the surface of the second planarization insulating layer 40 hydrophobic, is particularly desirable. For example, the second planarization insulating layer 40 can be reformed by exposing it for 5 to 30 seconds to a plasma of a gas containing $CF_4$ created at a gas pressure of 20 Pa and RF power of 1 $W/cm^2$.

Ion Implantation Technique

By implanting ions in the TFT substrate 32 with the second planarization insulating layer 40 formed thereon, moisture is removed from the second planarization insulating layer 40, which at the same time is reformed to have reduced moisture absorption. Ions usable are inert gas ions, individual element or their compound ions of fluorine, boron, nitrogen, oxygen, aluminum, sulfur, chlorine, gallium, germanium, arsenic, selenium, bromine, antimony, iodine, indium, tin, tellurium, lead, bismuth, titanium, niobium, hafnium and tantalum. Ion-implantation at high energy can reform not only the surface but also the inside of the second planarization insulating layer 40. For example, the second planarization insulating layer 40 may be reformed by an ion-implantation at an acceleration energy of 40 to 140 keV and a dosage of $1 \times 10^{14}$ to $1 \times 10^{16}$ $cm^{-2}$.

Ultraviolet Light Irradiation Technique

By irradiating ultraviolet light to the TFT substrate 32 formed with the second planarization insulating layer 40, the second planarization insulating layer 40 is reformed to have a reduced moisture absorption. The irradiation of ultraviolet light, which does not require the vacuum state, can reform the second planarization insulating layer 40 easily. For example, the second planarization insulating layer 40 may be reformed by an irradiation of ultraviolet light at 10 $mW/cm^2$ for 1 to 5 minutes.

Referring back to FIG. 2B, a contact hole is formed in the second planarization insulating layer 40 in a position corresponding to the hole injecting electrode 34. The reforming processing for the second planarization insulating layer 40 may be carried out before or after the formation of the contact hole. If the reforming processing is carried out before the formation of the contact hole, there may be no need to take into consideration damage to the hole injecting electrode 34 at the bottom of the contact hole. An ion implantation processing, which is capable of reforming even the inside of the second planarization insulating layer 40 by the use of high acceleration energy, may be conducted before the formation of the contact hole. On the other hand, if the reforming processing is carried out after the formation of the contact hole, not only the surface of the second planarization insulating layer 40 but also the side wall of the contact hole can be reformed. The plasma processing and the ultraviolet irradiation, which are both designed to reform the surface of the second planarization insulating layer 40, may be carried out after the formation of the contact hole in order to reform the side wall of the contact hole also. Moreover, an ultraviolet irradiation using a raised irradiation intensity may be conducted before the formation of the contact hole so as to reform the inside of the second planarization insulating layer 40 also.

Figure 4:
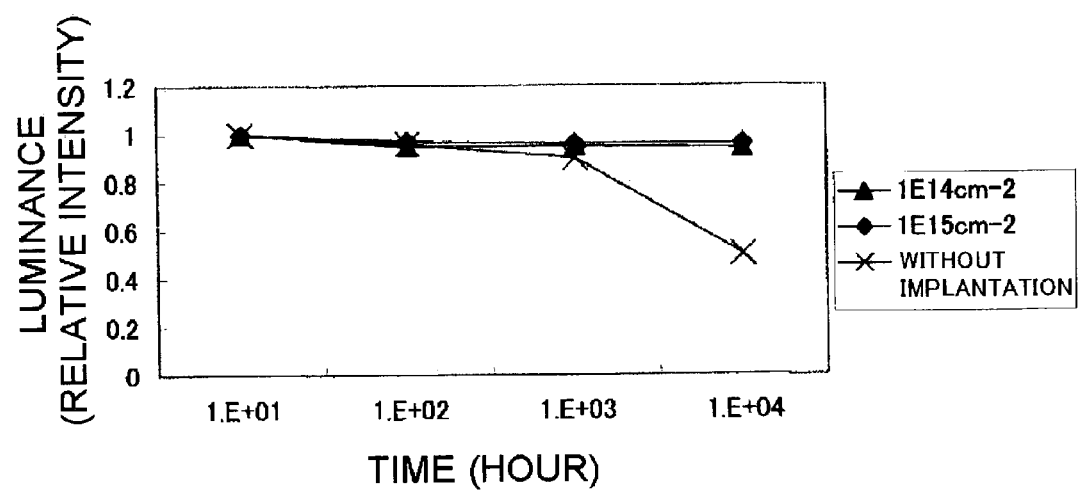
FIG. 4 shows the results of an experiment on luminescence characteristics of an organic EL element when an ion implantation processing of was performed according to a second embodiment of the present invention.

FIG. 4 shows the results of an experiment on luminescence characteristics of the organic EL element when an implantation processing of Ar ions to the second planarization insulating layer 40 has been performed. The vertical axis represents the luminance (relative intensity) whereas the horizontal axis represents the time of use (in hours). Ar ions were implanted at an acceleration energy of 140 keV and a dosage of $1 \times 10^{14}$ $cm^{-2}$ and $1 \times 10^{15}$ $cm^{-2}$. For comparison, the luminescence characteristics of the organic EL element for which Ar ion implantation was not conducted are also shown. The results of this experiment indicate that if a reforming by ion implantation is not performed on the second planarization insulating layer 40, the luminescence characteristics of the organic EL element deteriorate in a short time, so that the organic EL element without the reforming processing cannot survive the long-term usage. On the other hand, it is evident that when a reforming by ion implantation is performed on the second planarization insulating layer 40, the luminescence characteristics of the organic EL element scarcely deteriorate over a long time.

Third Embodiment

In a third embodiment of the present invention, the second planarization insulating layer 40 is coated to lessen the undesirable effect of the moisture contained therein on an organic EL layer disposed above the second planarization insulating layer 40. According to the third embodiment, a coating processing is performed in substitution for the heat treatment of the first embodiment to form a coating layer, and the subsequent processes are the same as those described in the first embodiment. It is to be noted here that a method for manufacturing the organic EL panel may be realized by combining the heat treatment of the first embodiment with the reforming processing of the second embodiment. Some of specific examples of the coating method are described hereinbelow.

Coating of Barrier Film

A barrier film impervious to moisture is coated on the second planarization insulating layer 40 so as to protect the organic EL layer 50 from moisture. The organic EL layer 50 is formed on the barrier film. This barrier film is formed by a thin film of, for instance, $SiN_x$, diamond-like carbon or Si. By forming the barrier film by any one of such materials, a barrier performance against moisture is improved compared to a case where the barrier film is formed of $SiN_x$. An $SiN_x$ film may be formed by, for instance, a plasma CVD method, at an $NH_3/SiH_4$ gas flow ratio of 1 to 3, a substrate temperature of 200° C., a pressure of 5 to 50 Pa and an RF power density of 1 to 3 W/cm². A diamond-like carbon film may be formed by, for instance, the plasma CVD method, at an $H_2/C_2H_4$ gas flow ratio of 0.1 to 0.5, a substrate temperature of 100° C., a pressure of 5 to 50 Pa and an RF power density of 2 to 4 W/cm².

Coating of Hydrophobic Material

A hydrophobic material is coated on the second planarization insulating layer 40 so as to prevent the permeation of moisture into the second planarization insulating layer 40, thus lowering the moisture content of the second planarization insulating layer 40. The organic EL layer 50 is formed on the coating layer. This coating may be performed using a coating technique such as spin coating or spray coating or using a vapor deposition method. The hydrophobic material to be used is preferably a hydrocarbon such as hexamethyldisilazane, an organic silicon compound having a hydrophobic group such as fluorocarbon, or fluororesin.

Figure 5:
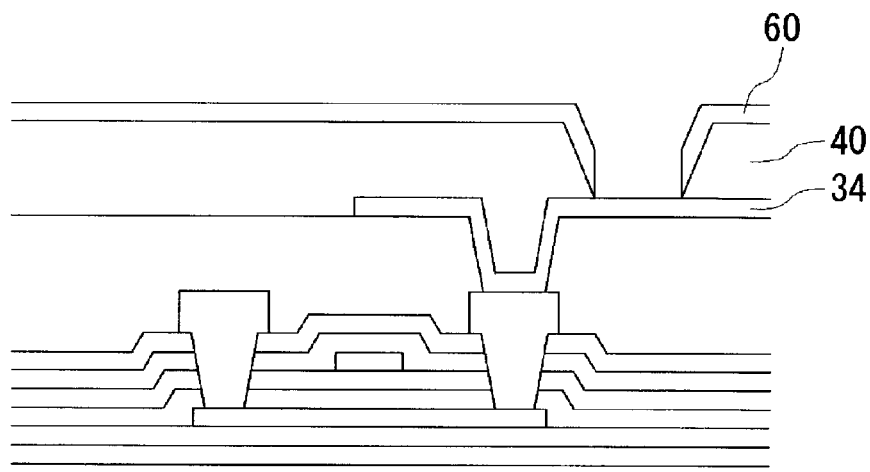
FIG. 5 illustrates a state wherein a coating layer is formed.

Referring back to FIG. 2B, a contact hole is formed in the second planarization insulating layer 40 in a position corresponding to the hole injecting electrode 34. The coating on the second planarization insulating layer 40 may be carried out before or after the formation of the contact hole. If a coating processing is performed before the formation of the contact hole, the formation of a contact hole that reaches the hole injecting electrode 34 can be realized in a single process. On the other hand, if the coating processing is performed after the formation of the contact hole, a coating film is formed also on the hole injecting electrode 34 at the bottom of the contact hole. Thus, the coating film formed at the bottom of the contact hole needs to be removed. Though this removal process may increase the number of manufacturing processes, the coating film 60 is formed also on the side wall of the contact hole, thus improving the moisture suppressing effect. FIG. 5 illustrates a state wherein a coating film 60 is formed also on the side wall of the contact hole. With the coating process performed after the formation of the contact hole, the coating film 60 does not suffer any damage at the formation of the contact hole.

Figure 6:
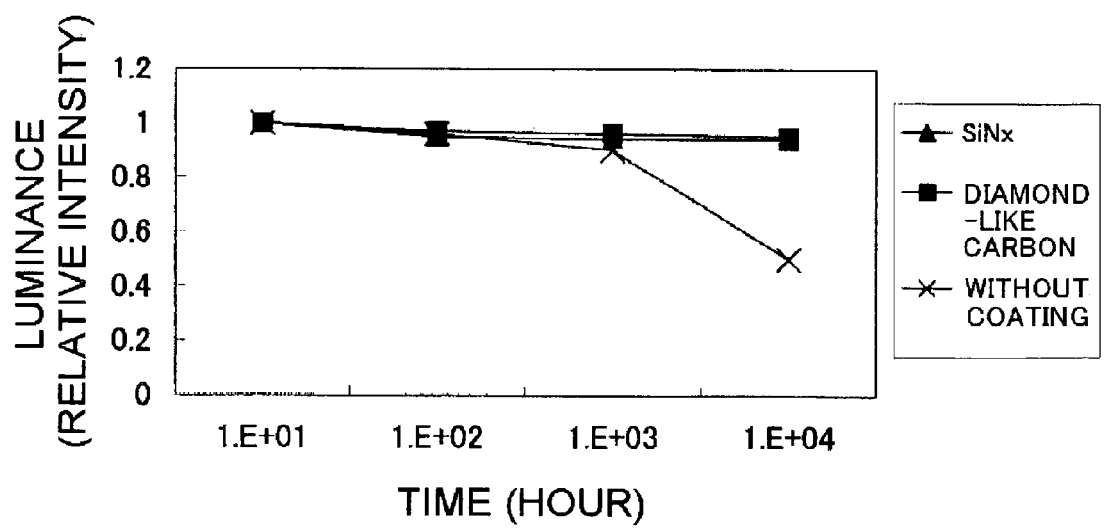
FIG. 6 shows the results of an experiment on luminescence characteristics of an organic EL element when a second planarization insulating layer is coated with an $SiN_x$ or diamond-like carbon film, according to a third embodiment of the present invention.

FIG. 6 shows the results of an experiment on luminescence characteristics of the organic EL element when the second planarization insulating layer is coated with an $SiN_x$ or diamond-like carbon film. The coating was done on the second planarization insulating layer 40 after the formation of the contact hole. The vertical axis represents the luminance (relative intensity) whereas the horizontal axis represents the time of use (in hours). For comparison, the luminescence characteristics of the organic EL element for which the coating was not performed are also shown. The results of this experiment indicate that if this coating is not performed, the luminescence characteristics of the organic EL element deteriorate in a short time, so that the organic EL element cannot tolerate usage over a long time. On the other hand, it is evident that when a coating is done with $SiN_x$ or diamond-like carbon, the luminescence characteristics of the organic EL element hardly deteriorate over a long time.

The present invention has been described based on some embodiments which are only exemplary, but the technical scope of the present invention is not limited to the scope described in the those embodiments. It is understood by those skilled in the art that there exist other various modifications to the combination of each component and process described above and that such modifications are encompassed by the scope of the present invention.

Though materials of the organic layer to be vapor-deposited are indicated in the preferred embodiments, it is understood by those skilled in the art that these materials are only exemplary. In the above embodiments, description was made of an organic EL element as an example of the EL element, but an inorganic EL element may also serve as the EL element.

In the above embodiments, the thermal treatment, reforming processing and coating processing on the second planarization insulating layer 40 have been described as techniques for reducing the effects of moisture on the organic EL layer 50. It is to be noted, however, that those techniques may be used not only independently but also in combination. A combined use of such techniques can reduce more efficiently the effects of moisture on the organic EL layer 50. For example, a coating processing performed after a heat treatment is quite effective since it will reduce the moisture content of the second planarization insulating layer 40 and moreover will lessen the adverse effect of the moisture content on the organic EL layer 50. A coating processing performed after a reforming processing can also produce a similar advantageous effect.

Although the present invention has been described by way of exemplary embodiments, it should be understood that many changes and substitutions may further be made by those skilled in the art without departing from the scope of the present invention which is defined by the appended claims.

What is claimed is:

1. A method of manufacturing an electroluminescent panel, the method including:
    forming a first electrode on a TFT substrate;
    forming an insulating layer in the periphery of the first electrode;
    performing a heat treatment on the insulating layer so that a moisture content contained in the insulating layer is substantially lowered;
    forming an electroluminescent layer on the insulating layer; and
    forming a second electrode on the electroluminescent layers,
    wherein said performing the heat treatment is such that the insulating layer is heat-treated in a manner that the moisture content of the insulating layer is substantially 154 ng/cm³ or below.

* * * * *